United States Patent
Usami et al.

(10) Patent No.: US 9,524,894 B2
(45) Date of Patent: Dec. 20, 2016

(54) TRANSPORT DEVICE WITH ROTATING RECEIVING PART

(71) Applicant: DAIFUKU CO., LTD., Osaka-shi, Osaka (JP)

(72) Inventors: Makoto Usami, Shiga (JP); Yukio Iizuka, Shiga (JP)

(73) Assignee: DAIFUKU CO., LTD., Osaka (JP)

( * ) Notice: Subject to any disclaimer, the term of this patent is extended or adjusted under 35 U.S.C. 154(b) by 0 days.

(21) Appl. No.: 14/729,294

(22) Filed: Jun. 3, 2015

(65) Prior Publication Data

US 2015/0357211 A1 Dec. 10, 2015

(30) Foreign Application Priority Data

Jun. 5, 2014 (JP) ................................ 2014-116320

(51) Int. Cl.
*H01L 21/677* (2006.01)
*H01L 21/673* (2006.01)
*H01L 21/687* (2006.01)

(52) U.S. Cl.
CPC ..... *H01L 21/6773* (2013.01); *H01L 21/67379* (2013.01); *H01L 21/67712* (2013.01); *H01L 21/67733* (2013.01); *H01L 21/68707* (2013.01)

(58) Field of Classification Search
CPC .............................................. H01L 21/67733
See application file for complete search history.

(56) References Cited

U.S. PATENT DOCUMENTS

| | | | | |
|---|---|---|---|---|
| 6,439,822 | B1* | 8/2002 | Kimura | H01L 21/67769 414/940 |
| 6,540,466 | B2* | 4/2003 | Bachrach | H01L 21/67733 414/939 |
| 7,780,020 | B2* | 8/2010 | Yoshitaka | H01L 21/67733 414/940 |
| 2008/0253870 | A1* | 10/2008 | Ford | B65G 47/907 414/225.01 |

FOREIGN PATENT DOCUMENTS

| | | | | |
|---|---|---|---|---|
| JP | 2002-362737 | | 12/2002 | ............. B65G 49/06 |
| JP | 2010150004 | A * | 7/2010 | ............. B65G 49/06 |

* cited by examiner

*Primary Examiner* — Gerald McClain
(74) *Attorney, Agent, or Firm* — Kusner & Jaffe

(57) ABSTRACT

A transport device simultaneously transports a plurality of articles with a simple device configuration. The transport device includes a chucking device that holds a magazine. An overhead carriage that transports the magazine held by the chucking device includes article storage parts that each accommodate the magazine held by the chucking device. The article storage parts include rotary tables that receive, from the chucking device, the magazine held by the chucking device. The rotary tables having received the magazines from the chucking device move from the chucking device to the article storage parts.

8 Claims, 5 Drawing Sheets

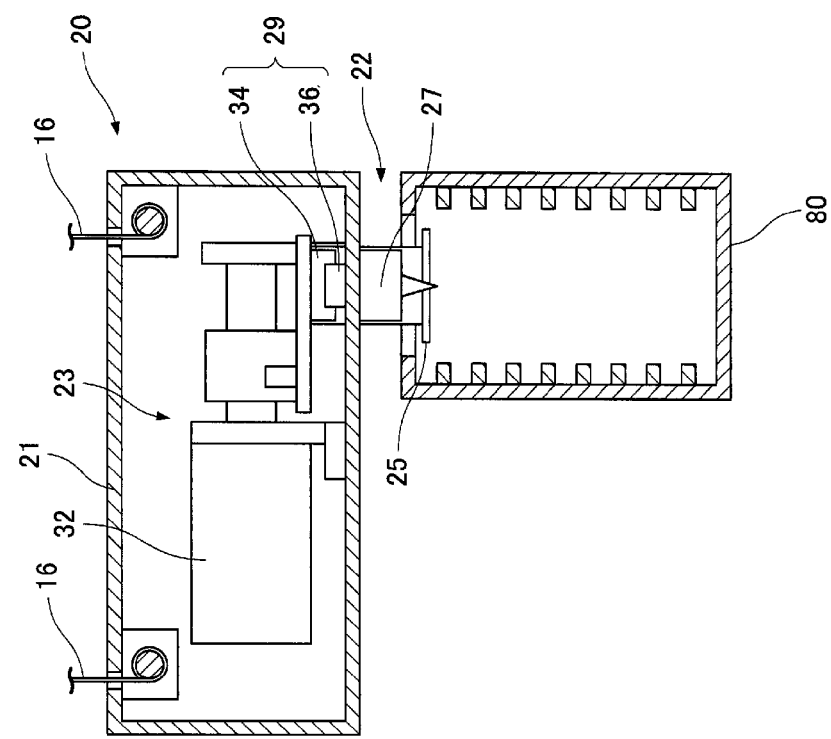
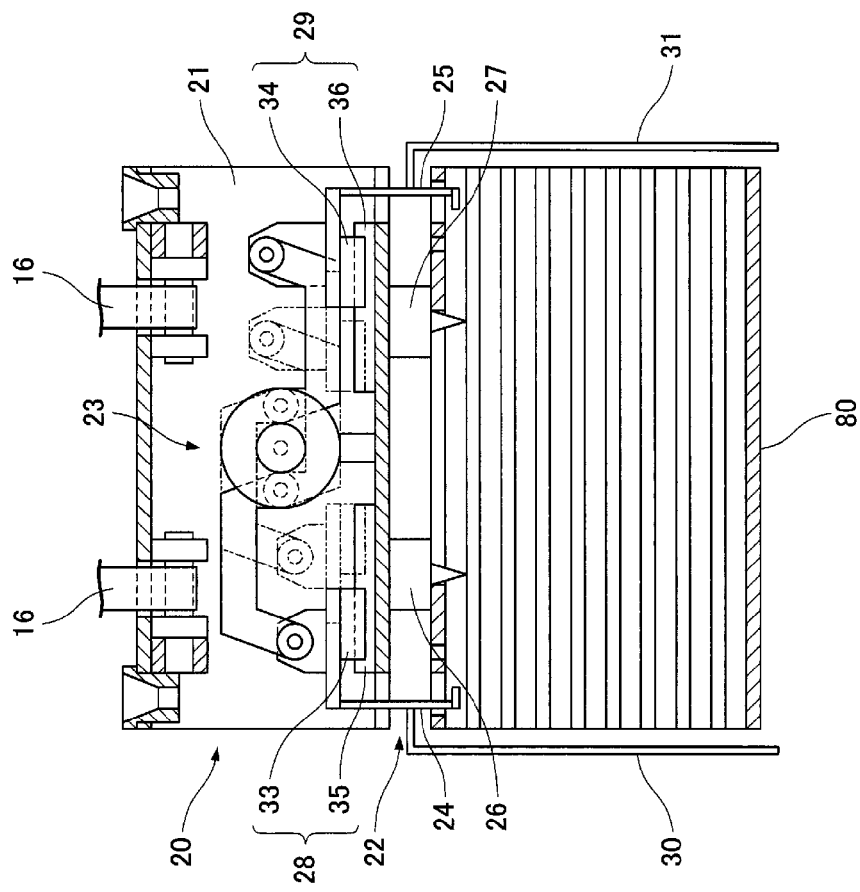
FIG. 3 (a)
FIG. 3 (b)

F I G. 4
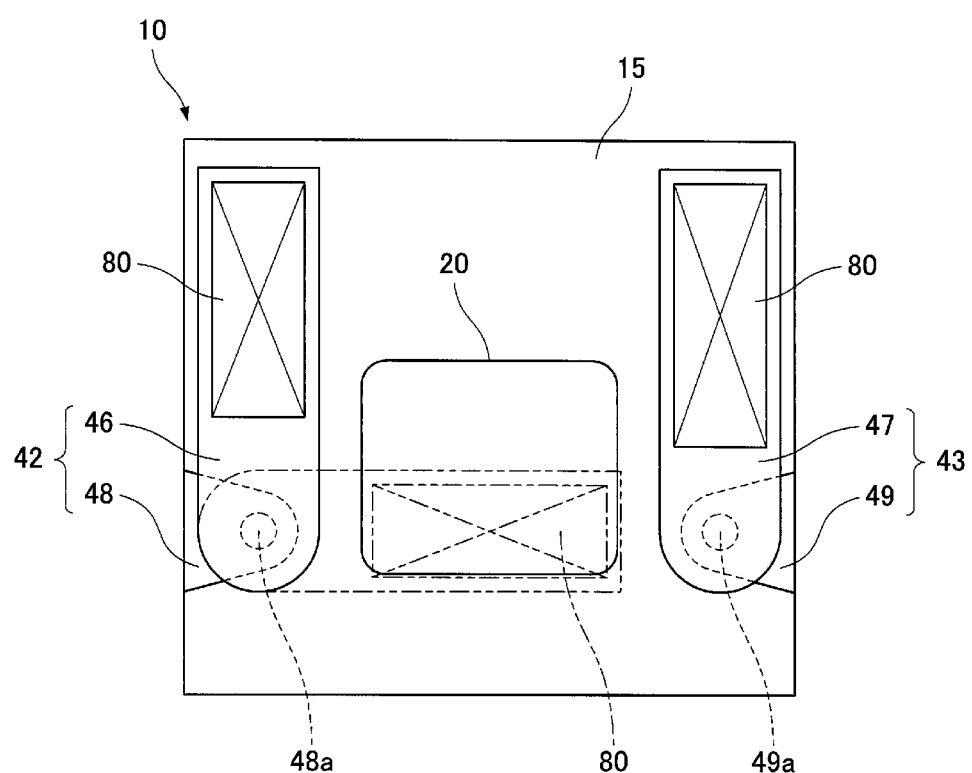

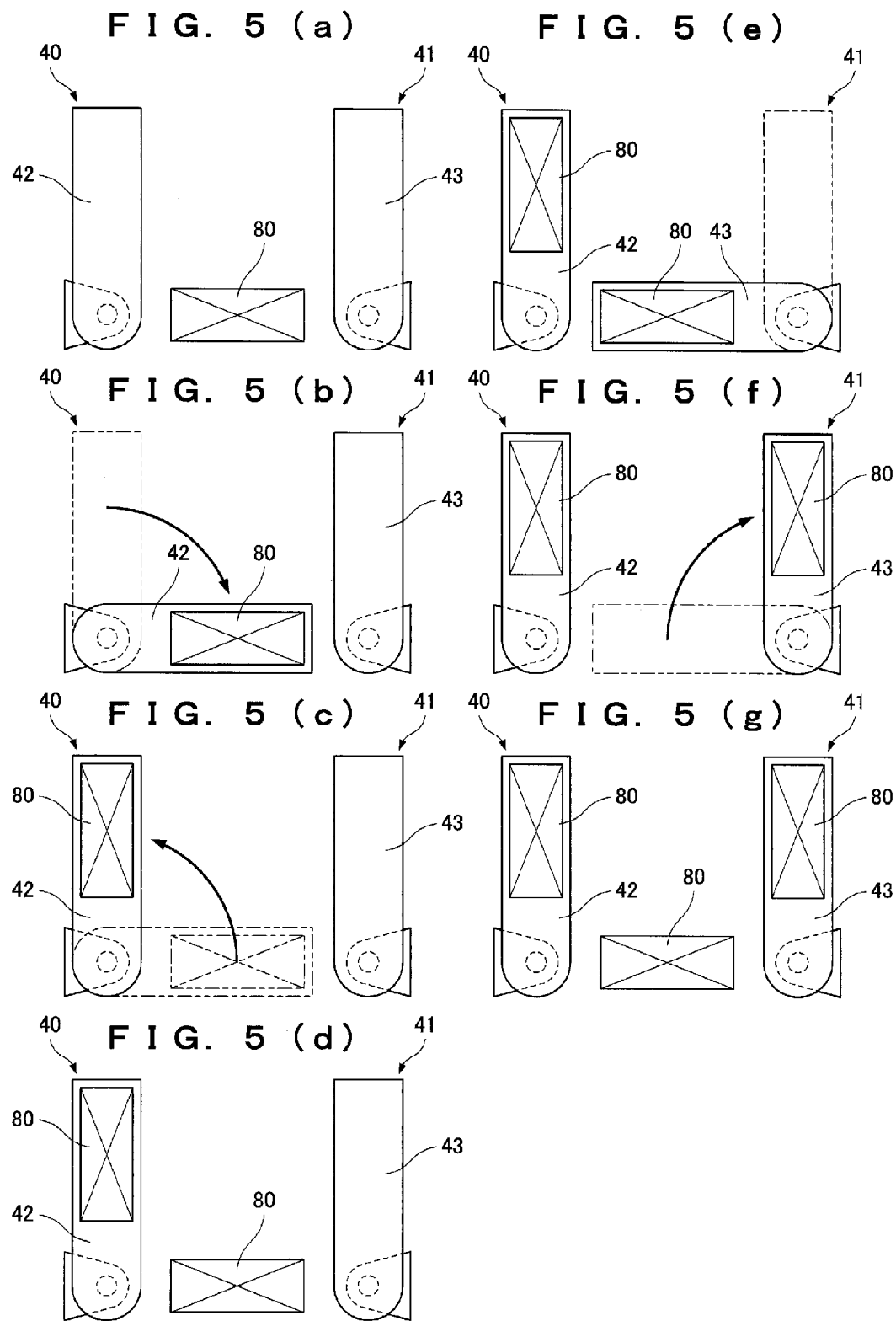

TRANSPORT DEVICE WITH ROTATING RECEIVING PART

RELATED APPLICATIONS

This application claims priority from Japanese Patent Application No. 2014-116320, filed with the Japanese Patent Office on Jun. 5, 2014, the entire content of which is hereby incorporated by reference.

FIELD OF THE INVENTION

The present invention relates to a transport device that transports works such as a semiconductor substrate and articles such as a transport container containing works.

BACKGROUND OF THE INVENTION

Conventionally, in production facilities for semiconductor devices and so on, works such as a semiconductor substrate and articles such as a transport container containing works may be sequentially transported between multiple processing units while being held by overhead carriages (transport devices) that travel along a traveling rail provided near the ceiling of a facility. Furthermore, multiple articles may be simultaneously transported by a single overhead carriage.

For example, Japanese Patent Laid-Open No. 2002-362737 discloses a mask transport device including a trolley that is movably connected to a track rail provided for transporting a pattern transfer mask to a mask storage device and a substrate processing device, is movable along the track rail, and is substantially horizontally rotatable about a portion connected to the track rail, and holding members that are provided on the trolley so as to hold a plurality of mask storage containers that accommodate pattern transfer masks.

In the transport device of Japanese Patent Laid-Open No. 2002-362737, the multiple holding members for holding the mask storage containers (articles) are provided on the trolley. The multiple mask storage containers held by the holding members are simultaneously transported.

In the transport device of Japanese Patent Laid-Open No. 2002-362737, however, the trolley needs the two or more holding members in order to simultaneously transport the multiple transport containers (articles). Moreover, a drive unit has to be provided for driving all the holding members. Thus, the transport device has a complicated device structure.

An object of the present invention is to provide a transport device that can simultaneously transport multiple articles with a simple device configuration.

SUMMARY OF THE INVENTION

The problem to be solved by the present invention is solved by the following solutions:

A transport device according to a first aspect of the present invention is a transport device including an article holding device that holds an article, the transport device transporting the article held by the article holding device, the transport device including an article storage part that accommodates the article held by the article holding device, the article storage part including a receiving part that receives, from the article holding device, the article held by the article holding device, the receiving part being moved with the article received from the article holding device, from the article holding device to the article storage part.

With this configuration, the article held by the article holding device is received by the receiving part, and then the received article is moved from the article holding device to the article storage part. In other words, the article held by the article holding device is moved from the holding position of the article holding device to another position (article storage part).

According to an invention described in a second aspect, in the transport device according to the first aspect, the receiving part is provided so as to rotate relative to the article storage part, the receiving part being rotated so as to move the article received from the article holding device, from the article holding device to the article storage part.

With this configuration, the article is moved from the article holding device to the article storage part by rotating the receiving part having received the article.

According to an invention described in a third aspect, the transport device according to the first or second aspect further includes an elevating device that vertically moves the article held by the article holding device, the article storage part being provided along the elevating path of the article moved by the elevating device.

With this configuration, the article is stored into the article storage part so as to avoid the elevating path of the article moved by the elevating device.

The transport device of the present invention can transport the article in a state in which the article held by the single article holding device is moved into the article storage part. Thus, a plurality of articles can be simultaneously transported with a simple device configuration.

BRIEF DESCRIPTION OF THE DRAWINGS

FIG. 3(a) is a front cross-sectional view showing a chucking device in the overhead carriage;

FIG. 3(b) is a side cross-sectional view showing the chucking device in the overhead carriage;

FIG. 4 is a plan view showing the vicinity of article storage parts in the overhead carriage; and FIGS. 5(a) through 5(g) are plan schematic diagrams showing the rotations of rotary tables in the overhead carriage.

DETAILED DESCRIPTION OF THE PREFERRED EMBODIMENTS

An overhead carriage 10 will be first described below as an example of a transport device according to the present invention.

Figure 1:
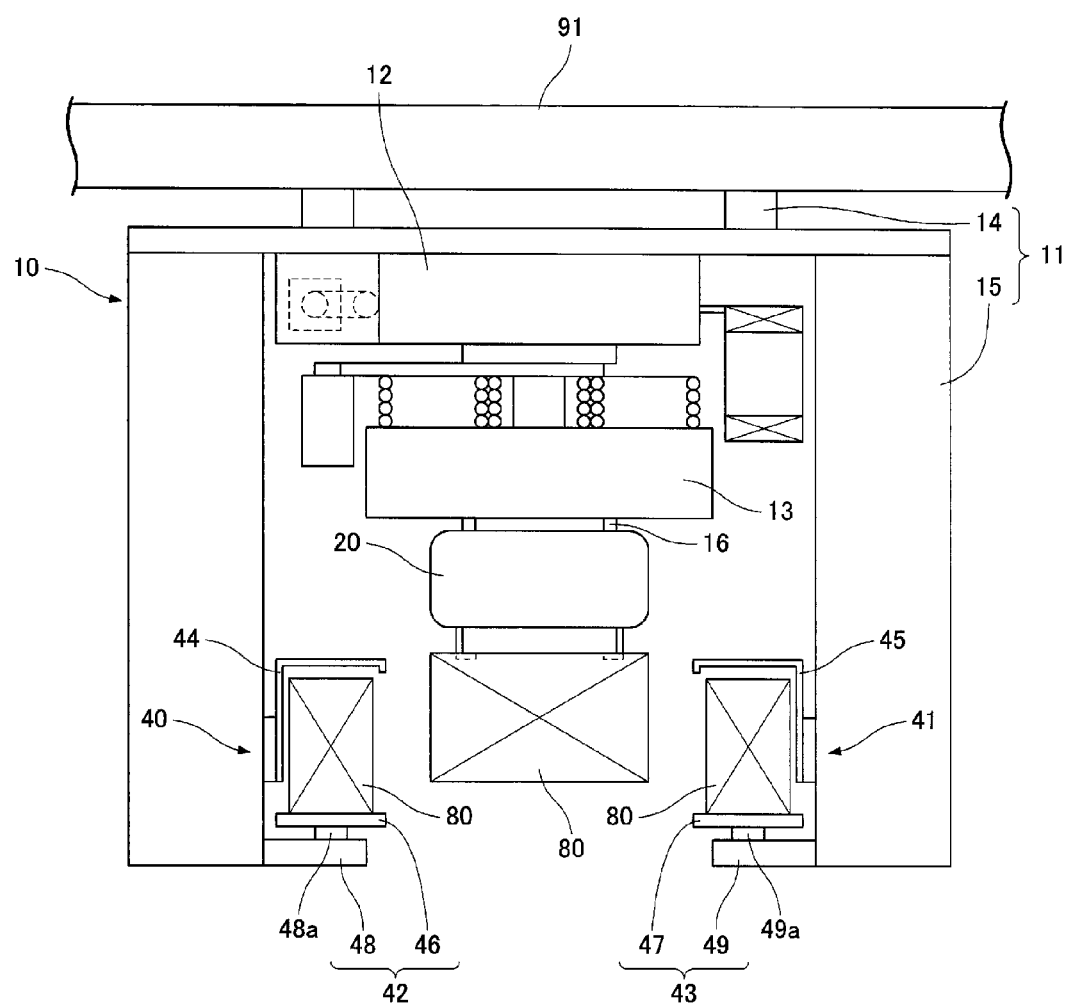
FIG. 1 is a front schematic diagram showing an overhead carriage as an example of a transport device according to the present invention.

As shown in FIG. 1, the overhead carriage 10 transports works (an example of an "article", not shown) such as a semiconductor substrate to a plurality of processing units (not shown) for performing predetermined processing on the works. The overhead carriage 10 transports a plurality of (three in FIG. 1) stored and held magazines 80 (an example of an "article") that contain the works.

Figure 2:
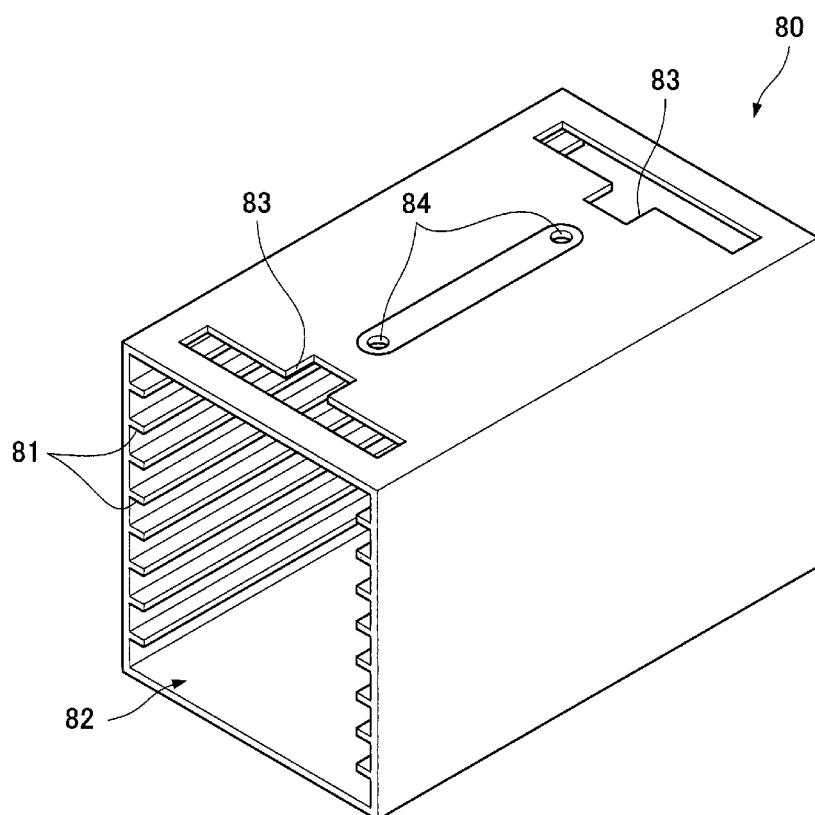
FIG. 2 is a perspective view showing a magazine transported by the overhead carriage.

As shown in FIG. 2, the magazine 80 transported by the overhead carriage 10 is a box transport container substantially shaped like a rectangular parallelepiped. The magazine 80 contains placing parts 81 capable of accommodating a plurality of works in multiple stages. The magazine 80 stores works from storage ports 82 longitudinally opened on two longitudinal ends of the magazine 80. The top surface of the magazine 80 has first engaging holes 83 that are engaged with the chucking members (chucking members 24 and 25) of a chucking device 20 and second engaging holes 84 that are engaged with the positioning guides (positioning guides 26 and 27) of the chucking device 20. The magazine 80 is not limited to the configuration of FIG. 2 as long as the magazine 80 is typically shaped and sized so as to accommodate works such as a semiconductor substrate.

As shown in FIG. 1, the overhead carriage 10 is attached so as to be suspended from a traveling rail 91 provided near a facility ceiling. The overhead carriage 10 is movable along the traveling rail 91. The overhead carriage 10 is mainly composed of a carriage body 11, a horizontal driving unit 12, an elevating unit 13 (an example of an "elevating device"), the chucking device 20, and article storage parts 40 and 41.

The carriage body 11 is the main part of the overhead carriage 10. The carriage body 11 is substantially shaped like a box. The carriage body 11 is mainly composed of a traveling part 14 and a casing part 15.

The traveling part 14 allows the horizontal driving unit 12 to drive the overhead carriage 10 along the traveling rail 91 fixed to the ceiling. The traveling part 14 is provided on the top of the overhead carriage 10.

The casing part 15 contains and supports the horizontal driving unit 12, the elevating unit 13, the chucking device 20, and the article storage parts (article storage parts 40 and 41). The casing part 15 has a hollow part. The casing part 15 is supported by the traveling part 14 so as to be suspended from the traveling part 14.

The horizontal driving unit 12 enables traveling of the overhead carriage 10. The horizontal driving unit 12 is provided in the upper part of the casing part 15. The horizontal driving unit 12 drives the traveling part 14, allowing the overhead carriage 10 to travel along the traveling rail 91.

The elevating unit 13 moves up and down the supported chucking device 20, that is, the magazine 80 held by the chucking device 20. The elevating unit 13 in the casing part 15 is supported below the horizontal driving unit 12. The elevating unit 13 has a plurality of elevating belts 16. The elevating unit 13 simultaneously winds up and unwinds the elevating belts 16. The winding and unwinding of the elevating belts 16 vertically move the chucking device 20 that is substantially kept in a horizontal position while being suspended and supported by the elevating belts 16. The elevating unit 13 vertically moves the chucking device 20, allowing the magazine 80 held by the chucking device 20 to vertically move (the vertical path of the magazine 80) between a position (the holding position of the magazine 80) where the chucking device 20 moves down to hold the magazine 80 and a position (the delivery position of the magazine 80) where the chucking device 20 delivers the magazine 80 to rotary tables (rotary tables 42 and 43).

The chucking device 20 holds the magazine 80. The chucking device 20 in the casing part 15 is supported under the elevating unit 13 so as to move in the vertical direction.

As shown in FIGS. 3(*a*) and 3(*b*), the chucking device 20 holds the magazine 80 so as to catch the top of the magazine 80. The chucking device 20 is mainly composed of a device body 21, a holding unit 22 for holding the magazine 80, and a driving unit 23 for driving the holding unit 22.

The device body 21 is the main part of the chucking device 20. The device body 21 is shaped like a box. The elevating belts 16 of the elevating unit 13 are attached to the top of the device body 21. The device body 21 can be vertically moved by driving the elevating unit 13.

The holding unit 22 holds the magazine 80 so as to catch the top of the magazine 80. The holding unit 22 is provided on the lower end of the device body 21.

The holding unit 22 is mainly composed of the two chucking members (chucking members 24 and 25) and the two positioning guides (positioning guides 26 and 27). The holding unit 22 holds the magazine 80 by means of the two chucking members that catch the top of the magazine 80 in the longitudinal direction of the magazine 80.

The chucking members (chucking members 24 and 25) hold the top of the magazine 80. One end of the chucking member (chucking members 24 and 25) is engaged with the first engaging hole 83 on the magazine 80. Another end of the chucking member (chucking members 24 and 25) is fixed to the guide part (guide parts 33 and 34) of a sliding member (sliding members 28 and 29). Moreover, a popping preventing member (popping preventing members 30 and 31) is provided at the midpoint of the chucking member (chucking members 24 and 25) so as to prevent works stored in the magazine 80 from popping out of the magazine 80.

The positioning guides (positioning guides 26 and 27) are guide members for positioning the magazine 80 at a position where the magazine 80 is held by the chucking members (chucking members 24 and 25). The positioning guides (positioning guides 26 and 27) are provided on the lower end of the device body 21. The positioning guides (positioning guides 26 and 27) are engaged with the second engaging holes 84 so as to position the magazine 80.

The driving unit 23 moves the chucking members (chucking members 24 and 25) in the longitudinal direction of the magazine 80. The driving unit 23 is provided in the device body 21. The driving unit 23 is mainly composed of a motor 32 and the sliding members (sliding members 28 and 29).

The motor 32 moves the sliding members (sliding members 28 and 29).

The sliding members (sliding members 28 and 29) move the chucking members (chucking members 24 and 25) in the longitudinal direction of the magazine 80. The sliding member (sliding members 28 and 29) includes the guide part (guide parts 33 and 34) that supports the chucking member (chucking members 24 and 25) and a guide rail (guide rails 35 and 36) for sliding the guide part (guide parts 33 and 34). The motor 32 is operated such that the first guide part 33 and the second guide part 34 slide on the guide rails (guide rails 35 and 36) so as to move toward or away from each other.

As shown in FIGS. 1 and 4, the article storage parts (article storage parts 40 and 41) store the magazines 80 held by the chucking device 20. The article storage parts (article storage parts 40 and 41) are supported on the inner walls of the casing part 15 in the lower part of the casing part 15. Specifically, the first article storage part 40 and the second article storage part 41 are supported with a predetermined distance on the respective inner walls of the casing part 15 in the longitudinal direction of the casing part 15. In this case, "predetermined distance" does not allow the article storage parts (article storage parts 40 and 41) to come into contact with the chucking device 20 or the magazine 80 when the elevating unit 13 vertically moves the magazine 80. The first article storage part 40 and the second article storage part 41 are spaced at the predetermined distance from each other. Thus, the multiple magazines 80 can be stored so as to avoid the elevating path of the magazines 80 moved by the elevating unit 13. Furthermore, the elevating unit 13 can move another magazine 80 held by the chucking device 20 up into the casing part 15.

The article storage part (article storage parts 40 and 41) is mainly composed of the rotary table (rotary tables 42 and 43, an example of a "receiving part") on which the magazine 80 is to be placed and a retainer (retainers 44 and 45) for retaining the magazine 80 placed on the rotary table (rotary tables 42 and 43).

The rotary table (rotary tables 42 and 43) receives the magazine 80 from the chucking device 20 that holds the magazine 80, and then the rotary table stores the magazine 80 at a predetermined position in the casing part 15. The rotary table (rotary tables 42 and 43) is mainly composed of a table part (table parts 46 and 47) on which the magazine 80 is to be placed and a rotating part (rotating parts 48 and 49) for rotating the table part (table parts 46 and 47).

The table part (table parts 46 and 47) is a plate-like member that is large enough to have the magazine 80 placed. In the transportation of the magazine 80, the table parts (table parts 46 and 47) are disposed perpendicularly to the longitudinal direction of the magazine 80 that is vertically moved by the elevating unit 13. The positions of the table parts (table parts 46 and 47) correspond to the storage positions of the magazines 80. When the magazine 80 is received from the chucking device 20, the table part (table parts 46 and 47) having the magazine 80 placed is turned in a range of substantially 90° from the storage position of the magazine 80 to the delivery position of the magazine 80. In other words, the table part (table parts 46 and 47) is turned from the storage position of the magazine 80 to the delivery position of the magazine 80, the storage position being located along the elevating path of the magazines 80 moved by the elevating unit 13 (outside the elevating path of the magazines 80).

The rotating parts (rotating parts 48 and 49) rotatably support the table parts (table parts 46 and 47). The rotating parts (rotating parts 48 and 49) are supported at the lower end of the casing part 15, on the inner walls of the casing part 15. The rotating part (rotating parts 48 and 49) has a pivot shaft (pivot shafts 48a and 49a) that rotatably supports the lower part of one end of the table part (table parts 46 and 47). The pivot shafts (pivot shafts 48a and 49a) are driven by a motor (not shown) disposed in the casing part 15.

As shown in FIG. 1, the retainer (retainers 44 and 45) retains the magazine 80 placed on the rotary table (rotary tables 42 and 43) during the transportation of the magazine 80. The retainer (retainers 44 and 45) forms the upper part of the article storage part (article storage parts 40 and 41) and is supported on the inner wall of the casing part 15 so as to cover the top surface of the magazine 80.

The operations of the overhead carriage 10 (the rotating operations of the rotary tables 42 and 43) will be described below.

As shown in FIG. 1, first, the traveling overhead carriage 10 is moved above the magazine 80 to be transported by the overhead carriage 10 and is stopped. Subsequently, the elevating unit 13 moves down the chucking device 20 to the holding position of the magazine 80.

When the magazine 80 is held by the chucking device 20, as shown in FIG. 5(a), the elevating unit 13 moves up the chucking device 20 so as to lift the magazine 80 to the delivery position.

When the magazine 80 is moved up to the delivery position, as shown in FIG. 5(b), the first rotary table 42 is turned to the delivery position. Subsequently, the magazine 80 is released from the chucking device 20 and is placed on the first rotary table 42. When the magazine 80 is placed, the first rotary table 42 with the magazine 80 placed (received) turns the magazine 80 from the delivery position of the magazine 80 to the storage position of the magazine 80.

Thus, as shown in FIG. 5(c), the first magazine 80 is stored in the first article storage part 40.

As shown in FIG. 5(d), when the first magazine 80 is stored in the first article storage part 40, the elevating path of the magazine 80 between the first article storage part 40 and the second article storage part 41 becomes vacant. Thus, the elevating unit 13 moves down the chucking device 20 again to the holding position of the magazine 80. Subsequently, when the chucking device 20 holds the magazine 80, the elevating unit 13 moves up the chucking device 20 so as to lift the magazine 80 to the delivery position.

As shown in FIG. 5(e), when the magazine 80 is moved up to the delivery position, the second rotary table 43 is turned to the delivery position. Subsequently, the magazine 80 is released from the chucking device 20 and is placed on the second rotary table 43. When the magazine 80 is placed, the second rotary table 43 with the magazine 80 placed (received) turns the magazine 80 from the delivery position of the magazine 80 to the storage position of the magazine 80. Thus, as shown in FIG. 5(f), the second magazine 80 is stored in the second article storage part 41.

As shown in FIG. 5(g), when the second magazine 80 is stored in the second article storage part 41, the elevating unit 13 moves down the chucking device 20 again to the holding position of the magazine 80. Subsequently, when the chucking device 20 holds the magazine 80, the elevating unit 13 moves up the chucking device 20 so as to lift the magazine 80 to the delivery position. Thus, the third magazine 80 held by the chucking device 20 is kept at the delivery position.

In this way, the two magazines 80 are stored in the overhead carriage 10 so as to be placed (received) in the article storage parts (article storage parts 40 and 41) while the single magazine 80 held by the chucking device 20 is transported.

As has been discussed, in the overhead carriage 10, the magazines 80 held by the chucking device 20 are received by the rotary tables 42 and 43, and then the received magazines 80 are moved from the chucking device 20 to the article storage parts 40 and 41. In other words, the magazines 80 held by the chucking device 20 are moved from the holding position of the chucking device 20 to other positions (article storage parts 40 and 41). Thus, the multiple magazines 80 can be transported while the magazines 80 held by the single chucking device 20 are stored in the article storage parts 40 and 41. This can simultaneously transport the multiple magazines 80 with a simple configuration.

In the overhead carriage 10, the magazines 80 are moved from the chucking device 20 to the article storage parts 40 and 41 by turning the rotary tables 42 and 43 that have received the magazines 80. Thus, the magazines 80 can be moved in a smaller space than in the case where the magazines 80 are linearly moved. This can transport the magazines 80 while achieving a size reduction of the overall overhead carriage 10 (carriage body 11). Moreover, a transfer mechanism for the magazines 80 in the overhead carriage 10 (carriage body 11) can be more simplified than in the case where the magazines 80 are linearly moved.

Furthermore, in the overhead carriage 10, the magazines 80 are stored into the article storage parts 40 and 41 so as to avoid the elevating path of the magazines 80 moved by the elevating unit 13, allowing the single chucking device 20 to simultaneously transport the magazines 80.

In the present embodiment, a rotary mechanism is used, but not exclusively, to rotatably move the magazines 80 on the rotary tables 42 and 43. For example, the magazine 80 may be linearly moved by means of a sliding mechanism or a pantograph mechanism.

In the present embodiment, transport containers including the magazine 80 are transported, but not exclusively. Articles containing stacked materials such as a tray may be transported instead.

Moreover, in the present embodiment, the transport device is, but not exclusively, the overhead carriage 10 that travels on a ceiling. For example, the transport device may have a trolley body that travels on a floor and includes the chucking device 20 and the article storage parts 40 and 41.

Having described the invention, the following is claimed:

1. A transport device comprising a chucking device that holds an article, the transport device attached so as to be suspended from a traveling rail, the transport device transporting the article held by the chucking device,
   the transport device comprising an article storage part that accommodates the article held by the chucking device and travels with the chucking device along the traveling rail,
   the article storage part including a receiving part that receives, from the chucking device, the article held by the chucking device,
   the receiving part being moved with the article received from the chucking device, from the chucking device to the article storage part,
   wherein the receiving part is provided so as to rotate relative to the article storage part,
   wherein the receiving part is rotated so as to move the article received from the chucking device, from the chucking device to the article storage part, and
   wherein the receiving part is a rotary table configured to receive the article and move the article to be secured by a retainer.

2. The transport device according to claim 1, further comprising an elevating device that vertically moves the article held by the chucking device,
   the article storage part being provided along an elevating path of the article moved by the elevating device.

3. A transport device for transporting an article, the transport device being suspended from a traveling rail, the device comprising:
   a chucking device configured to hold the article and travel along the traveling rail; and
   an article storage part configured to accommodate the article held by the chucking device and travel along the traveling rail with the chucking device, the article storage part comprising a receiving part configured to receive the article from the chucking device and move the received article to the article storage part to be stored therein,
   wherein the receiving part is provided so as to rotate relative to the article storage part,
   wherein the receiving part is rotated so as to move the article received from the chucking device, from the chucking device to the article storage part, and
   wherein the receiving part is a rotary table configured to receive the article and move the article to be secured by a retainer.

4. The transport device according to claim 3, wherein the receiving part is configured to rotate in one direction to receive the article from the chucking device and rotate in another direction to store the received article within the article storage part.

5. The transport device according to claim 3, wherein the article is a first article of a plurality of articles,
   wherein the chucking device is further configured to capture the first article, convey the first article to the receiving part, capture a second one of the articles, and hold the second article.

6. The transport device according to claim 5, further comprising a driving unit configured to transport the chucking device and the article storage part along the traveling rail,
   wherein the first article is stored within the article storage part and the second article is held by the chucking device while the driving unit is transporting the chucking device and the article storage part.

7. The transport device according to claim 3, wherein the article storage part further comprises the retainer, and
   wherein the retainer is configured to retain the stored article within the article storage part.

8. A transport device for storing articles therein and transporting the stored articles between processing units, the transport device being suspended from a traveling rail that is positioned between the processing units, the device comprising:
   an article storage part comprising a retainer and a rotary table, the retainer being configured to secure a first one of the articles for storage within the article storage part, the rotary table being configured to receive the first one of the articles and move the first one of the articles to be secured by the retainer;
   a chucking device configured to retrieve the first one of the articles, transfer the first one of the articles to the rotary table, retrieve a second one of the articles, and hold the second one of the articles during a driving of the chucking device along the traveling rail; and
   a driving unit configured to drive the article storage part and the chucking device along the traveling rail.

* * * * *